US 8,606,102 B2

(12) United States Patent
Lee et al.

(10) Patent No.: US 8,606,102 B2
(45) Date of Patent: Dec. 10, 2013

(54) TEST INTERFACE DEVICE, TEST SYSTEM AND OPTICAL INTERFACE MEMORY DEVICE

(75) Inventors: Sang-Hoon Lee, Hwaseong-si (KR);
Eun-Jo Byun, Yongin-si (KR);
Cheol-Jong Woo, Suwon-si (KR);
Se-Jang Oh, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 646 days.

(21) Appl. No.: 12/592,817

(22) Filed: Dec. 3, 2009

(65) Prior Publication Data
US 2010/0150549 A1    Jun. 17, 2010

(30) Foreign Application Priority Data
Dec. 11, 2008  (KR) .................. 10-2008-0126070

(51) Int. Cl.
*H04B 10/08* (2011.01)
*H04B 17/00* (2006.01)

(52) U.S. Cl.
USPC .................. 398/9; 398/16; 398/17; 398/25

(58) Field of Classification Search
None
See application file for complete search history.

(56) References Cited

U.S. PATENT DOCUMENTS

| | | | | |
|---|---|---|---|---|
| 4,799,009 | A | * | 1/1989 | Tada et al. .............. 324/756.03 |
| 5,069,522 | A | * | 12/1991 | Block et al. .................... 385/39 |
| 5,148,504 | A | * | 9/1992 | Levi et al. ...................... 385/14 |
| 6,249,621 | B1 | * | 6/2001 | Sargent et al. ................. 385/24 |
| 6,959,126 | B1 | * | 10/2005 | Lofland et al. ................. 385/16 |
| 2002/0147947 | A1 | * | 10/2002 | Mayweather et al. ....... 714/704 |
| 2005/0079822 | A1 | * | 4/2005 | Boose et al. .............. 455/67.11 |
| 2006/0088319 | A1 | | 4/2006 | Morton |
| 2007/0198881 | A1 | * | 8/2007 | Volkerink et al. ............ 714/724 |
| 2008/0008477 | A1 | * | 1/2008 | Ogawa ......................... 398/164 |

FOREIGN PATENT DOCUMENTS

| | | |
|---|---|---|
| JP | 2002-22799 A | 1/2002 |
| JP | 2007-327817 A | 12/2007 |
| KR | 2002-0084840 A | 11/2002 |

* cited by examiner

*Primary Examiner* — Ken Vanderpuye
*Assistant Examiner* — Darren E. Wolf
(74) *Attorney, Agent, or Firm* — Onello & Mello, LLP

(57) ABSTRACT

A test interface device includes a serializer, an optical transmitter, an optical receiver, and a deserializer. The serializer receives parallel test signals from automatic test equipment, and serializes the parallel test signals into a serial test signal. The optical transmitter converts the serial test signal into an optical test signal. The optical receiver receives the optical test signal from the optical transmitter, and converts the optical test signal into the serial test signal. The deserializer deserializes the serial test signal into the parallel test signals, and transmits the parallel test signals to a device under test. As a result, signal transfer speed may be improved and optical resource usage may be reduced.

12 Claims, 9 Drawing Sheets

TEST INTERFACE DEVICE, TEST SYSTEM AND OPTICAL INTERFACE MEMORY DEVICE

CROSS-REFERENCE TO RELATED APPLICATION(S)

This application claims priority under 35 USC §119 to Korean Patent Application No. 10-2008-0126070, filed on Dec. 11, 2008, in the Korean Intellectual Property Office (KIPO), the contents of which are incorporated herein in its entirety by reference.

BACKGROUND

1. Field

The present invention relates to memory devices and an interface device used for testing memory devices. More particularly, the present invention relate to a test interface device, a test system, and an optical interface memory device.

2. Description of the Related Art

A test interface device receives a test signal from an automatic test equipment (ATE), and transmits the test signal to a device under test (DUT). For example, a probe card receives a test signal from the ATE, and transmits the test signal through a trace on a printed circuit board (PCB) to the DUT.

A conventional test interface device, such as a conventional probe card, cannot transfer a high speed signal having a high frequency of about 500 MHz, or more, due to a narrow bandwidth of the PCB. As a result, conventional test devices are limited.

SUMMARY

In accordance with aspects of the invention, provided is a test interface device capable of transferring a high speed signal and reducing required optical resources by employing a serialization and/or deserialization technique.

Also in accordance with aspects of the present invention, provided is a test system for reducing a test time required optical resources by employing a serialization and/or deserialization technique.

And further in accordance with the present invention, provided is an optical interface memory device for improving data transfer speed by employing an optical signal transfer technique and reducing optical resource usage by employing a serialization and/or deserialization technique.

According to one aspect of the invention, a test interface device includes a first serializer, a first optical transmitter, a first optical receiver, and a first deserializer. The first serializer serializes parallel test signals received from an automatic test equipment into a serial test signal. The first optical transmitter converts the serial test signal into an optical test signal, and transmits the optical test signal through a first optical cable. The first optical receiver receives the optical test signal through the first optical cable, and converts the optical test signal into the serial test signal. The first deserializer the serial test signal into the parallel test signals, and provides the parallel test signals to at least one device under test.

The test interface device may further include an optical splitter configured to receive the optical test signal from the first optical transmitter, and configured to generate split optical test signals by dividing a path of the optical test signal. The test interface device may further include additional first optical receivers, each of the additional first optical receivers being configured to receive one of the split optical test signals and to convert the one split optical test signals into the serial test signal.

The test interface device may further include additional first deserializers, each of the additional first deserializers being configured to deserialize the serial test signal received from each of the first additional optical receivers into the parallel test signals and to provide the parallel test signals to a corresponding device under test from the at least one device under test.

The test interface device may further include a second serializer configured to serialize parallel test result signals received from the device under test into a serial test result signal, a second optical transmitter configured to convert the serial test result signal into an optical test result signal and to transmit the optical test result signal through a second optical cable, a second optical receiver configured to receive the optical test result signal through the second optical cable and to convert the optical test result signal into the serial test result signal, and a second deserializer configured to deserialize the serial test result signal into the parallel test result signals and to provide the parallel test result signals to the automatic test equipment.

The test interface device may further include a result decision circuit configured to generate a result decision signal based on parallel test result signals received from the at least one device under test, a second optical transmitter configured to convert the result decision signal into an optical result decision signal and to transmit the optical result decision signal through a second optical cable, and a second optical receiver configured to receive the optical result decision signal through the second optical cable, to convert the optical result decision signal into the result decision signal, and to provide the result decision signal to the automatic test equipment.

The result decision circuit may be configured to store the parallel test signals received from the first deserializer and may generate the result decision signal by comparing the parallel test result signals with the stored parallel test signals.

The at least one device under test may be N devices under test, where N is a natural number greater than 1, and the test interface device may further include a result decision circuit configured to generate N result decision signals based on N parallel test result signals received from the N devices under test. The result decision circuit may further include a second serializer configured to serialize the N result decision signals into a serial result decision signal, a second optical transmitter configured to convert the serial result decision signal into an optical result decision signal and to transmit the optical result decision signal through a second optical cable, a second optical receiver configured to receive the optical result decision signal through the second optical cable and to convert the optical result decision signal into the serial result decision signal, and a second deserializer configured to deserialize the serial result decision signal into the N result decision signals and to provide the N result decision signals to the automatic test equipment.

The test interface device may further include an encoder configured to encode the parallel test signals received from the automatic test equipment and to provide the encoded parallel test signals to the first serializer.

The test interface device may further include a decoder configured to decode the parallel test signals received from the first deserializer and to provide the decoded parallel test signals to the device under test.

According to another aspect of the invention, a test system includes an automatic test equipment, a test interface device, and a device under test. The automatic test equipment generates parallel test signals. The test interface device serializes the parallel test signals into a serial test signal, converts the serial test signal into an optical test signal, transfers the optical test signal through an optical cable, converts the transferred optical test signal into the serial test signal, and deserializes the serial test signal into the parallel test signals. The device under test operates in response to the parallel test signals received from the test interface device.

The test interface device can further comprise an optical splitter configured to receive the optical test signal from the first optical transmitter and to generate split optical test signals by dividing a path of the optical test signal.

The test interface device can further comprise additional first optical receivers, each of the additional first optical receivers being configured to receive one of the split optical test signals and to convert the one of the split optical test signals into the serial test signal.

The test interface device can further comprise additional first deserializers, each of the additional first deserializers being configured to deserialize the serial test signal received from each of the additional first optical receivers into the parallel test signals and to provide the parallel test signals to a corresponding device under test from the at least one device under test.

The test interface device can further comprise a result decision circuit configured to generate a result decision signal based on parallel test result signals received from the at least one device under test; a second optical transmitter configured to convert the result decision signal into an optical result decision signal and to transmit the optical result decision signal through a second optical cable; and a second optical receiver configured to receive the optical result decision signal through the second optical cable, to convert the optical result decision signal into the result decision signal, and to provide the result decision signal to the automatic test equipment.

The at least one device under test can be N devices under test, where N is a natural number greater than 1, and the test interface device can further comprise a result decision circuit configured to generate N result decision signals based on N parallel test result signals received from the N devices under test; a second serializer configured to serialize the N result decision signals into a serial result decision signal; a second optical transmitter configured to convert the serial result decision signal into an optical result decision signal and to transmit the optical result decision signal through a second optical cable; a second optical receiver configured to receive the optical result decision signal through the second optical cable and to convert the optical result decision signal into the serial result decision signal; and a second deserializer configured to deserialize the serial result decision signal into the N result decision signals and to provide the N result decision signals to the automatic test equipment.

The test interface device may further include an encoder configured to encode the parallel test signals received from the automatic test equipment and to provide the encoded parallel test signals to the first serializer.

The test interface device may further include a decoder configured to decode the parallel test signals received from the first deserializer and to provide the decoded parallel test signals to the device under test.

According to yet another aspect of the invention, an optical interface memory device includes an optical receiver, a deserializer, and a memory core. The optical receiver receives an optical input signal through a first optical cable from a memory controller, and converts the optical input signal into a serial input signal. The deserializer deserializes the serial input signal into parallel input signals. The memory core operates in response to the parallel input signals received from the deserializer.

The optical interface memory device may further include a serializer configured to serialize parallel output signals received from the memory core into a serial output signal, and an optical transmitter configured to convert the serial output signal into an optical output signal and to transmit the optical output signal through a second optical cable to the memory controller.

According to the present inventive concept, the test interface device, the test system, and the optical interface memory device may be implemented to improve signal transfer speed by employing an optical signal transfer technique. Further, the test interface device, the test system, and the optical interface memory device according to the present inventive concept may be implemented to reduce optical resource usage by employing a serialization and/or deserialization technique.

BRIEF DESCRIPTION OF THE DRAWINGS

Aspects of the present invention will be more clearly understood from the following detailed description, taken in conjunction with the accompanying drawings.

FIGS. 1, 2, 3, 4 and 5 are block diagrams illustrating an embodiment of a test system including a test interface device, in accordance with aspects of the present inventive concept.

FIG. 6 is a block diagram illustrating an embodiment of a test interface device, in accordance with aspects of the present inventive concept.

FIG. 7 is a block diagram illustrating an embodiment of a test system, in accordance with aspects of the present inventive concept.

FIG. 8 is a block diagram illustrating an embodiment of an optical interface memory device, in accordance with aspects of the present inventive concept.

FIG. 9 is a block diagram illustrating an embodiment of a system including an optical interface memory device in accordance with example embodiments of the present inventive concept.

DESCRIPTION OF EMBODIMENTS

Figure 1:
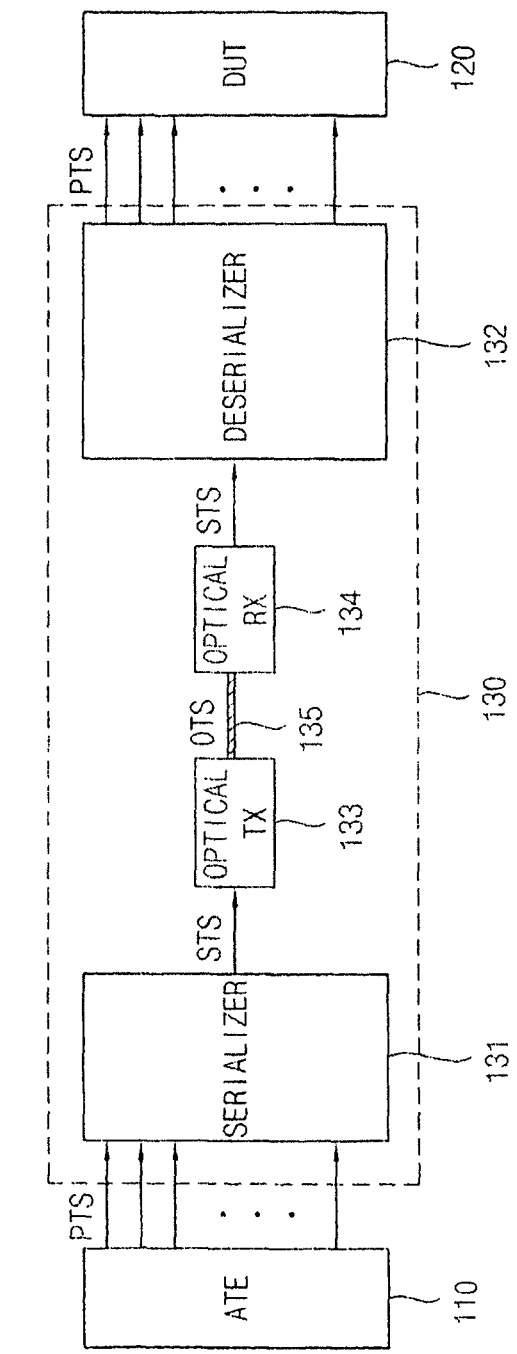
FIGS. 1 to 9 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will convey the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

FIG. 1 is a block diagram illustrating an embodiment of a test system including a test interface device, in accordance with aspects of the present inventive concept.

Referring to the embodiment of FIG. 1, a test system 100 includes automatic test equipment (ATE) 110, a device under test (DUT) 120, and a test interface device 130.

The ATE 110 generates parallel test signals PTS to test the DUT 120. The test interface device 130 receives the parallel test signals PTS from the ATE 110, and transmits the parallel test signals PTS to the DUT 120. The DUT 120 receives the parallel test signals PTS from the test interface device 130, and operates based on the parallel test signals PTS. For example, when a manufacturing process of a semiconductor device is finished, electrical parameters of the semiconductor device may be measured for a pass/fail test of the manufactured semiconductor device. The ATE 110 may generate the parallel test signals PTS for the pass/fail test, and the test interface device 130 may apply the parallel test signals PTS received from the ATE 110 to a plurality of pads formed on the semiconductor device. The DUT 120 (e.g., the semiconductor device) may perform a predetermined operation in response to the parallel test signals PTS received through the pads.

In some embodiments, the DUT 120 may generate parallel test result signals as a result of the predetermined operation. The test interface device 130 may receive the parallel test result signals from the DUT 120, and may transmit the parallel test result signals to the ATE 110. The ATE 110 may determine whether the DUT 120 passes or fails based on the parallel test result signals.

The test interface device 130 may include a serializer 131, a deserializer 132, an optical transmitter 133, an optical receiver 134, and an optical cable 135, as in the present embodiment.

The serializer 131 receives the parallel test signals PTS from the ATE 110, and serializes the parallel test signals PTS into a serial test signal STS. The optical transmitter 133 receives the serial test signal STS from the serializer 131, and converts the serial test signal STS into an optical test signal OTS. The optical transmitter 133 may transmit the optical test signal OTS through the optical cable 135 to the optical receiver 134. The optical receiver 134 receives the optical test signal OTS through the optical cable 135, and converts the optical test signal OTS into the serial test signal STS. The deserializer 132 receives the serial test signal STS from the optical receiver 134, deserializes the serial test signal STS into the parallel test signals PTS, and transmits the parallel test signals PTS to the DUT 120.

As described above, the test interface device 130, according to some aspects of the present inventive concept, may include the optical transmitter 133 and the optical receiver 134 to transfer a test signal at high speed using an optical signal transfer technique. Accordingly, implementations of the present inventive concept may increase the overall test speed of the test system 100.

Further, the test interface device 130, according to some example embodiments of the present inventive concept, may include the serializer 131 and the deserializer 132 to reduce optical resources using a serialization and/or deserialization technique. For example, if the parallel test signals PTS are ten test signals, ten pairs of optical transmitters and optical receivers are required to transfer the parallel test signals PTS. However, the test interface device 130, according to some aspects of the present inventive concept, may include only one pair of the optical transmitter 133 and the optical receiver 134 to transfer the parallel test signals PTS using the serialization and/or deserialization technique. In addition, even though a pair of a conventional optical transmitter and a conventional optical receiver supports multiple channels, the conventional optical transmitter and the conventional optical receiver includes multiple pairs of optical modules. In contrast, the test interface device 130 according to some example embodiments of the present inventive concept may include only one pair of optical modules to transfer the parallel test signals PTS using the serialization and/or deserialization technique.

Figure 2:
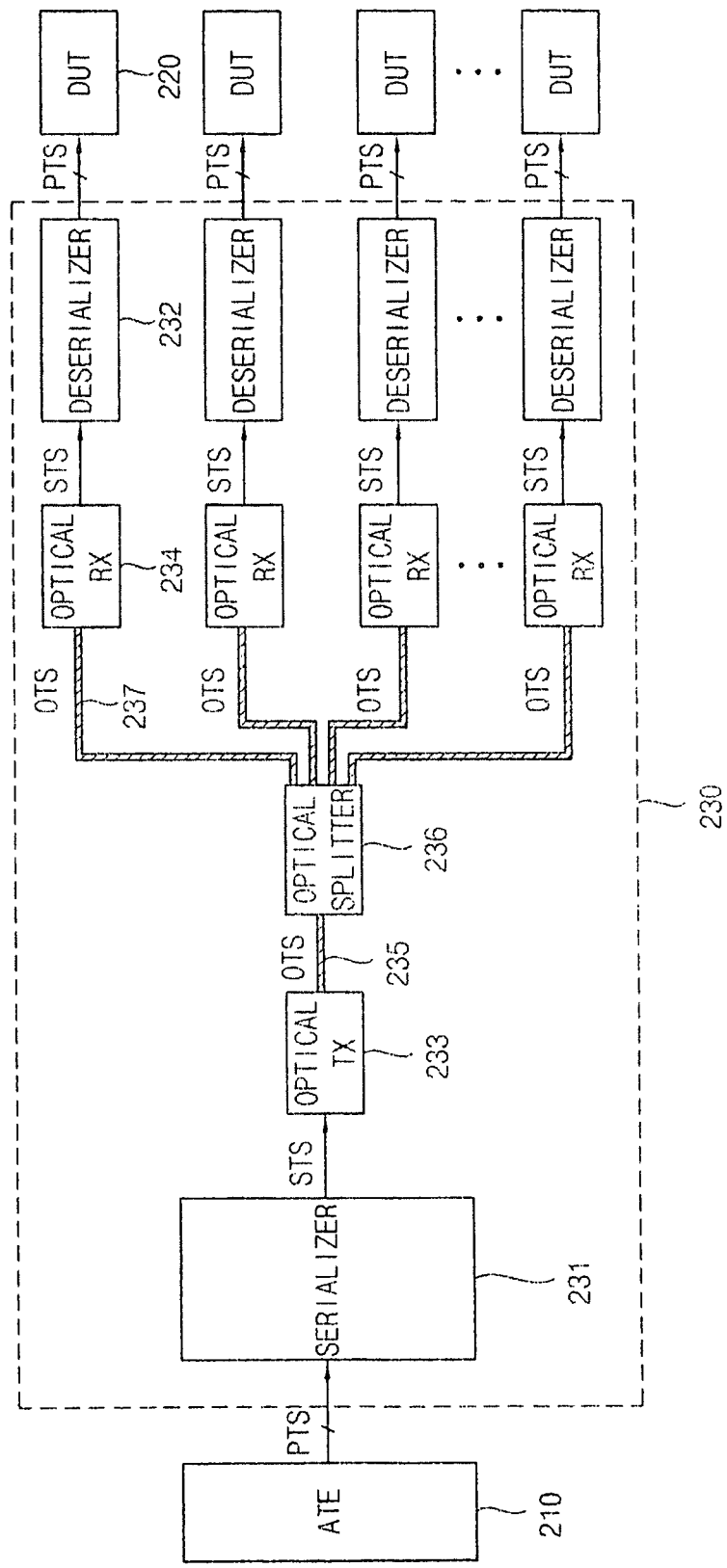

FIG. 2 is a block diagram illustrating an embodiment of a test system including a test interface device in accordance with aspects of the present inventive concept.

Referring to the embodiment of FIG. 2, a test system 200 includes an ATE 210, a plurality of DUTs 220, and a test interface device 230.

The ATE 210 generates parallel test signals PTS to test the DUTs 220. The test interface device 230 receives the parallel test signals PTS from the ATE 210, and transmits the parallel test signals PTS to each of the DUTs 220. Each of the DUTs 220 receives the parallel test signals PTS from the test interface device 230, and operates based on the parallel test signals PTS. The number of the DUTs 220 included in the test system 200 may vary depending on the test environment.

The test interface device 230 may include a serializer 231, a plurality of deserializers 232, an optical transmitter 233, a plurality of optical receivers 234, a first optical cable 235, an optical splitter 236, and a plurality of second optical cables 237. The test interface device 230 may include N deserializers 232, N optical receivers 234, and N second optical cables 237, where N is a natural number greater than 1.

The serializer 231 receives the parallel test signals PTS from the ATE 210, and serializes the parallel test signals PTS into a serial test signal STS. The optical transmitter 233 receives the serial test signal STS from the serializer 231, and converts the serial test signal STS into an optical test signal OTS. The optical transmitter 233 may transmit the optical test signal OTS through the first optical cable 235 to the optical splitter 236. The optical splitter 236 receives the optical test signal OTS from the optical transmitter 233, and generates N split optical test signals by dividing a path of the optical test signal OTS into N paths. That is, the optical test signal OTS may be transformed into the N split optical test signals by the optical splitter 236. The optical splitter 236 may transmit the N split optical test signals through the N second optical cables 237 to the N optical receivers 234, respectively. In some embodiments, the optical splitter 236 and the N optical receivers 234 may be implemented as one device. Each of the N optical receivers 234 receives the optical test signal OTS through a corresponding second optical cable 237, and converts the optical test signal OTS into the serial test signal STS. Each of the N deserializers 232 receives the serial test signal STS from a corresponding optical receiver 234, deserializes the serial test signal STS into the parallel test signals PTS, and transmits the parallel test signals PTS to a corresponding DUT 220. In some embodiments, the N deserializers 232 may be implemented as one device. In other embodiments, two or more deserializers 232 may be implemented as one device.

As described above, the test interface device 230, according to some example embodiments of the present inventive concept, may include the optical transmitter 233 and the N optical receivers 234 to transfer a test signal at high speed using an optical signal transfer technique. Accordingly, implementations of the present inventive concept may increase the overall test speed of the test system 200. Further, the test interface device 230, according to some example embodiments of the present inventive concept, may include the optical splitter 236 to simultaneously test the plurality of DUTs 220. Accordingly, implementations of the present inventive concept may further increase the overall test speed of the test system 200.

Further, the test interface device 230, according to some example embodiments of the present inventive concept, may include the serializer 231 and the N deserializers 232 to reduce optical resources using a serialization and/or deserialization technique. Accordingly, the size of the test interface device 230 may be reduced, and the plurality of DUTs 220 may be simultaneously tested using the reduced number of resources.

Figure 3:
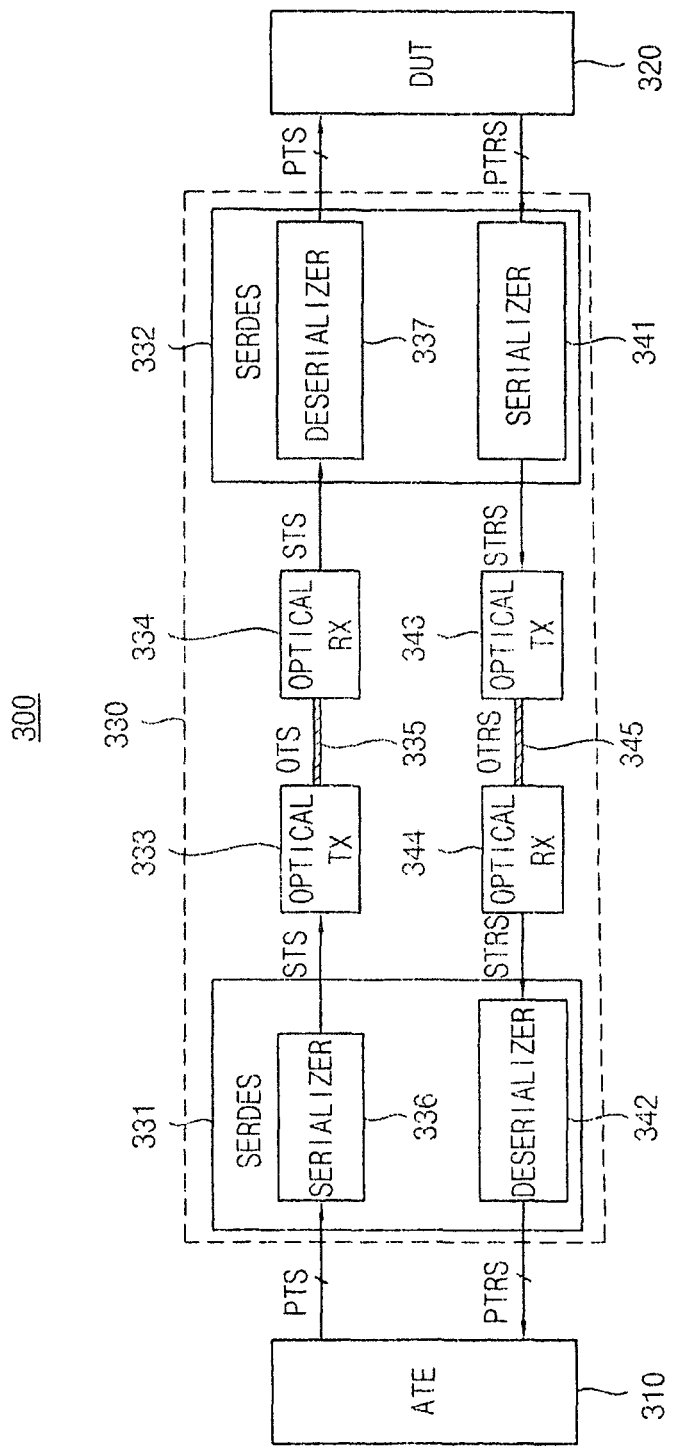

FIG. 3 is a block diagram illustrating an embodiment of a test system including a test interface device, in accordance with example embodiments of the present inventive concept.

Referring to the embodiment of FIG. 3, a test system 300 includes an ATE 310, a DUT 320, and a test interface device 330.

The ATE 310 generates parallel test signals PTS to test the DUT 320. The test interface device 330 receives the parallel test signals PTS from the ATE 310, and transmits the parallel test signals PTS to the DUT 320. The DUT 320 receives the parallel test signals PTS from the test interface device 330, and operates based on the parallel test signals PTS. The DUT 320 may generate parallel test result signals PTRS as a result of the operation responsive to the parallel test signals PTS. The test interface device 330 may receive the parallel test result signals PTRS from the DUT 320, and may transmit the parallel test result signals PTRS to the ATE 310. The ATE 310 may determine whether the DUT 320 passes or fails based on the parallel test result signals PTRS.

The test interface device 330 may include a first Serializer/Deserializer (or "SerDes") device 331, a second SerDes device 332, a first optical transmitter 333, a first optical receiver 334, a first optical cable 335, a second optical transmitter 343, a second optical receiver 344, and a second optical cable 345. The first SerDes device 331 may include a first serializer 336 and a second deserializer 342, and the second SerDes device 332 may include a first deserializer 337 and a second serializer 341.

The first serializer 336 receives the parallel test signals PTS from the ATE 310, and serializes the parallel test signals PTS into a serial test signal STS. The first optical transmitter 333 receives the serial test signal STS from the first serializer 336, and converts the serial test signal STS into an optical test signal OTS. The first optical transmitter 333 may transmit the optical test signal OTS through the first optical cable 335 to the first optical receiver 334. The first optical receiver 334 receives the optical test signal OTS through the first optical cable 335, and converts the optical test signal OTS into the serial test signal STS. The first deserializer 337 receives the serial test signal STS from the first optical receiver 334, deserializes the serial test signal STS into the parallel test signals PTS, and transmits the parallel test signals PTS to the DUT 320. The DUT 320 may perform a predetermined operation in response to the parallel test signals PTS, and may generate the parallel test result signals PTRS as a result of the predetermined operation.

The second serializer 341 receives the parallel test result signals PTRS from the DUT 320, and serializes the parallel test result signals PTRS into a serial test result signal SIRS. The second optical transmitter 343 receives the serial test result signal SIRS from the second serializer 341, and converts the serial test result signal SIRS into an optical test result signal OTRS. The second optical transmitter 343 may transmit the optical test result signal OTRS through the second optical cable 345 to the second optical receiver 344. The second optical receiver 344 receives the optical test result signal OTRS through the second optical cable 345, and converts the optical test result signal OTRS into the serial test result signal SIRS. The second deserializer 342 receives the serial test result signal SIRS from the second optical receiver 344, deserializes the serial test result signal SIRS into the parallel test result signals PTRS, and transmits the parallel test result signals PTRS to the ATE 310. The ATE 310 may determine whether the DUT 320 passes or fails based on the parallel test result signals PTRS.

As described above, the test interface device 330, according to some example embodiments of the present inventive concept, may include the first and second optical transmitters 333 and 343 and the first and second optical receivers 334 and 344 to transfer a test signal and a test result signal at high speed using an optical signal transfer technique. Accordingly, implementations of the present inventive concept may increase the overall test speed of the test system 300.

Further, the test interface device 330, according to some example embodiments of the present inventive concept, may include the first and second serializers 336 and 341 and the first and second deserializers 337 and 342 to reduce optical resources using a serialization and/or deserialization technique. Accordingly, the size of the test interface device 330 may be reduced, and the DUT 320 may be tested using the reduced number of resources.

Figure 4:
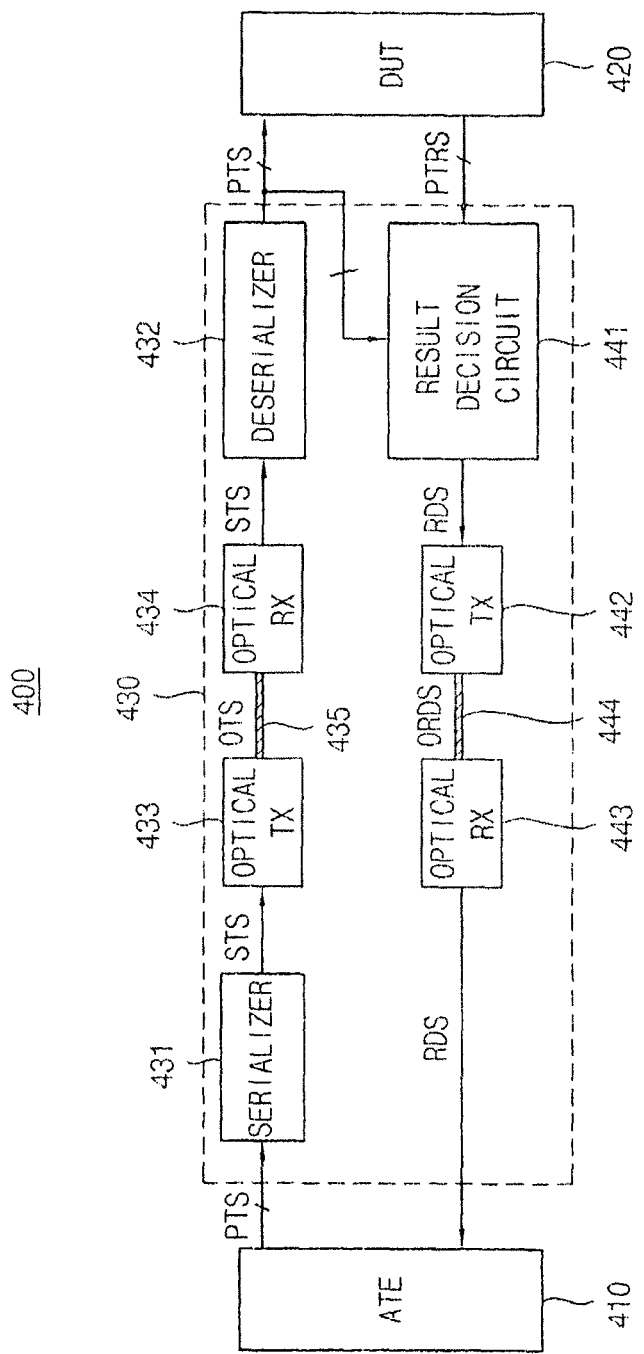

FIG. 4 is a block diagram illustrating an embodiment of a test system including a test interface device in accordance with example embodiments of the present inventive concept.

Referring to the embodiment of FIG. 4, a test system 400 includes an ATE 410, a DUT 420, and a test interface device 430.

The ATE 410 generates parallel test signals PTS to test the DUT 420. The test interface device 430 receives the parallel test signals PTS from the ATE 410, and transmits the parallel test signals PTS to the DUT 420. The DUT 420 receives the parallel test signals PTS from the test interface device 430, and operates based on the parallel test signals PTS. The DUT 320 may generate parallel test result signals PTRS as a result of the operation responsive to the parallel test signals PTS. The test interface device 430 may receive the parallel test result signals PTRS from the DUT 420, may determine whether the DUT 420 passes or fails, and may generate a result decision signal RDS based on a result of the determination. The ATE 410 may identify whether the DUT 420 passes or fails based on the result decision signal RDS received from the test interface device 430.

The test interface device 430 may include a serializer 431, a deserializer 432, a first optical transmitter 433, a first optical receiver 434, a first optical cable 435, a result decision circuit 441, a second optical transmitter 442, a second optical receiver 443, and a second optical cable 444.

The test interface device 430 transmits the parallel test signals PTS from the ATE 410 to the DUT 420. The DUT 420 performs a predetermined operation in response to the parallel test signals PTS, and generates the parallel test result signals PTRS as a result of the predetermined operation.

The result decision circuit 441 receives the parallel test result signals PTRS from the DUT 420, and generates the result decision signal RDS in response to the parallel test result signals PTRS. In some embodiments, the result decision circuit 441 may store the parallel test signals PTS, and may compare the parallel test result signals PTRS with the stored parallel test signals PTS. For example, if the parallel test result signals PTRS are the same as the stored parallel test signals PTS, the result decision circuit 441 may generate the result decision signal RDS indicating that the DUT 420 passes. The result decision circuit 441 may include registers that store the parallel test signals PTS and logic gates that compare the parallel test result signals PTRS with the stored parallel test signals PTS. In other embodiments, the result decision circuit 441 may store predetermined values before the test system 400 operates, and may compare the parallel test result signals PTRS with the stored values.

The second optical transmitter 442 receives the result decision signal RDS from the result decision circuit 441, and converts the result decision signal RDS into an optical result decision signal ORDS. The second optical transmitter 442 may transmit the optical result decision signal ORDS through the second optical cable 444 to the second optical receiver 443. The second optical receiver 443 receives the optical result decision signal ORDS through the second optical cable 444, converts the optical result decision signal ORDS into the result decision signal RDS, and transmits the result decision signal RDS to the ATE 410. The ATE 410 may identify whether the DUT 420 passes or fails based on the result decision signal RDS, and may display whether the DUT 420 passes or fails.

As described above, the test interface device 430, according to some aspects of the present inventive concept, may include the first and second optical transmitters 433 and 442 and the first and second optical receivers 434 and 443, used to transfer a test signal and a test result signal at high speed using an optical signal transfer technique. Accordingly, implementations of the present inventive concept can increase the overall test speed of the test system 400.

Further, the test interface device 430, according to some aspects of the present inventive concept, may include the serializer 431 and the deserializer 432 to reduce optical resources using a serialization and/or deserialization technique. Accordingly, the size of the test interface device 430 may be reduced, and the DUT 420 may be tested using the reduced number of resources.

Figure 5:
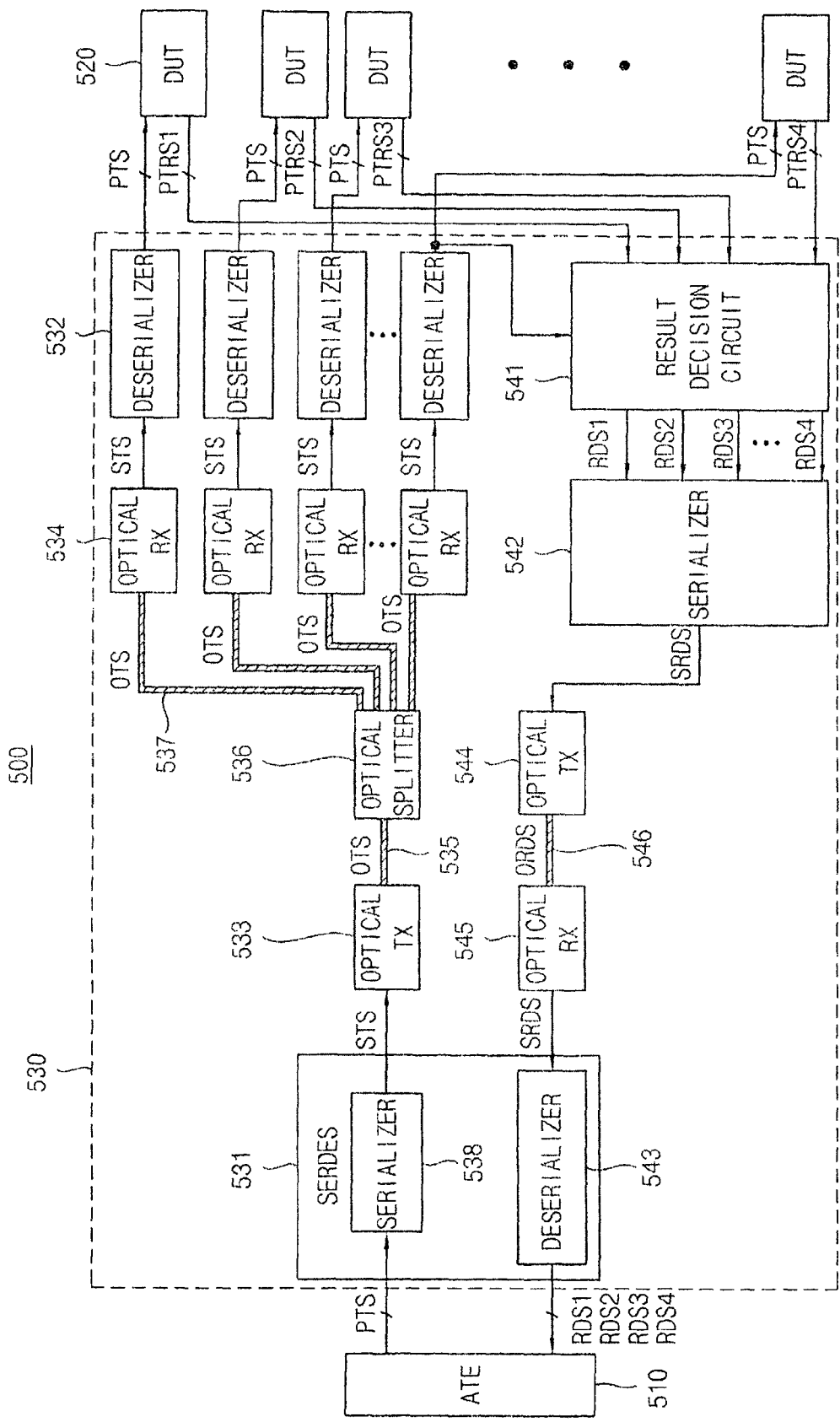

FIG. 5 a block diagram illustrating an embodiment of a test system including a test interface device, in accordance with aspects of the present inventive concept.

Referring to the embodiment of FIG. 5, a test system 500 includes an ATE 510, a plurality of DUTs 520, and a test interface device 530.

The ATE 510 generates parallel test signals PTS to test the DUTs 520. The test interface device 530 receives the parallel test signals PTS from the ATE 510, and transmits the parallel test signals PTS to each of the DUTs 520. Each of the DUT 520 receives the parallel test signals PTS from the test interface device 530, and operates based on the parallel test signals PTS. Each of the DUT 520 may generate parallel test result signals PTRS as a result of the operation responsive to the parallel test signals PTS. The test interface device 530 may receive the parallel test result signals PTRS1, PTRS2, PTRS3 and PTRS4 from each of the DUT 520, may determine whether each of the DUT 520 passes or fails, and may generate result decision signals RDS1, RDS2, RDS3 and RDS4 based on a result of the determinations. The ATE 510 may identify whether each of the DUT 520 passes or fails based on the result decision signals RDS1, RDS2, RDS3 and RDS4 received from the test interface device 530.

The test interface device 530 may include a first serializer 538, a plurality of first deserializers 532, a first optical transmitter 533, a plurality of first optical receivers 534, a first optical cable 535, an optical splitter 536, a plurality of second optical cables 537, a result decision circuit 541, a second serializer 542, a second deserializer 543, a second optical transmitter 544, a second optical receiver 545, and a third optical cable 546. The first serializer 538 and a second deserializer 543 may be implemented as a SerDes device 531. The test interface device 530 may include N first deserializers 532, N first optical receivers 534, and N second optical cables 537, where N is a natural number greater than 1.

The test interface device 530 transmits the parallel test signals PTS from the ATE 410 to the respective DUTs 520. Each of the DUTs 520 performs a predetermined operation in response to the parallel test signals PTS, and generates the parallel test result signals PTRS1, PTRS2, PTRS3 and PTRS4 as a result of the predetermined operation.

The result decision circuit 541 receives the N parallel test result signals PTRS1, PTRS2, PTRS3 and PTRS4 from the N DUTs 520, and generates the N result decision signals RDS1, RDS2, RDS3 and RDS4 in response to the N parallel test result signals PTRS1, PTRS2, PTRS3 and PTRS4, respectively. In some embodiments, the result decision circuit 541 may receive the parallel test signals PTS from one of the N first deserializers 532, may store the parallel test signals PTS, and may compare each of the N parallel test result signals PTRS1, PTRS2, PTRS3 and PTRS4 with the stored parallel test signals PTS. For example, if one of the N parallel test result signals PTRS1, PTRS2, PTRS3 and PTRS4 is the same as the stored parallel test signals PTS, the result decision circuit 541 may generate a corresponding result decision signal indicating that a corresponding DUT 520 passes. The result decision circuit 541 may include registers that store the parallel test signals PTS and logic gates that compare each of the parallel test result signals PTRS1, PTRS2, PTRS3 and PTRS4 with the stored parallel test signals PTS. In other embodiments, the result decision circuit 541 may store predetermined values before the test system 500 operates, and may compare each of the parallel test result signals PTRS1, PTRS2, PTRS3 and PTRS4 with the stored values. While the test interface device 530 embodiment illustrated in FIG. 5 includes one result decision circuit 541, the test interface device 530 may include N result decision circuits, each of which receives the parallel test signals PTS from a corresponding one of the N first deserializers 532 and compares a corresponding one of the parallel test result signals PTRS1, PTRS2, PTRS3 and PTRS4 with the parallel test signals PTS.

The second serializer 542 receives the N result decision signals RDS1, RDS2, RDS3 and RDS4 corresponding to the N DUTs 520, respectively, and serializes the N result decision signals RDS1, RDS2, RDS3 and RDS4 into a serial result decision signal SRDS. The second optical transmitter 544 receives the serial result decision signal SRDS from the second serializer 542, and converts the serial result decision signal SRDS into an optical result decision signal ORDS. The second optical transmitter 544 may transmit the optical result decision signal ORDS through the third optical cable 546 to the second optical receiver 545. The second optical receiver 545 receives the optical result decision signal ORDS through the third optical cable 546, converts the optical result decision signal ORDS into the serial result decision signal SRDS. The second deserializer 543 receives the serial result decision signal SRDS from the second optical receiver 545, and deserializes the serial result decision signal SRDS into the N result decision signals RDS1, RDS2, RDS3 and RDS4. The ATE 510 may identify whether each of the DUTs 520 passes or fails based on the N result decision signals RDS1, RDS2, RDS3 and RDS4, and may display whether each of the DUTs 520 passes or fails.

As described above, the test interface device 530, according to some aspects of the present inventive concept, may include the first and second optical transmitters 533 and 544, the N first optical receivers 534 and the second optical receiver 545 to transfer a test signal and a test result signal at high speed using an optical signal transfer technique. Accordingly, overall test speed of the test system 500 may increase. Further, the test interface device 530, according to aspects of the present inventive concept, may include the optical splitter 536 to simultaneously test the plurality of DUTs 520. Accordingly, implementations of the present inventive concept may increase the overall test speed of the test system 500.

Further, the test interface device 530, according to some aspects of the present inventive concept, may include the first and second serializers 538 and 542, the N first deserializers 532, and the second deserializer 543 to reduce optical resources using a serialization and/or deserialization technique. Accordingly, the size of the test interface device 530 may be reduced, and the plurality of DUTs 520 may be simultaneously tested using the reduced number of resources.

Figure 6:
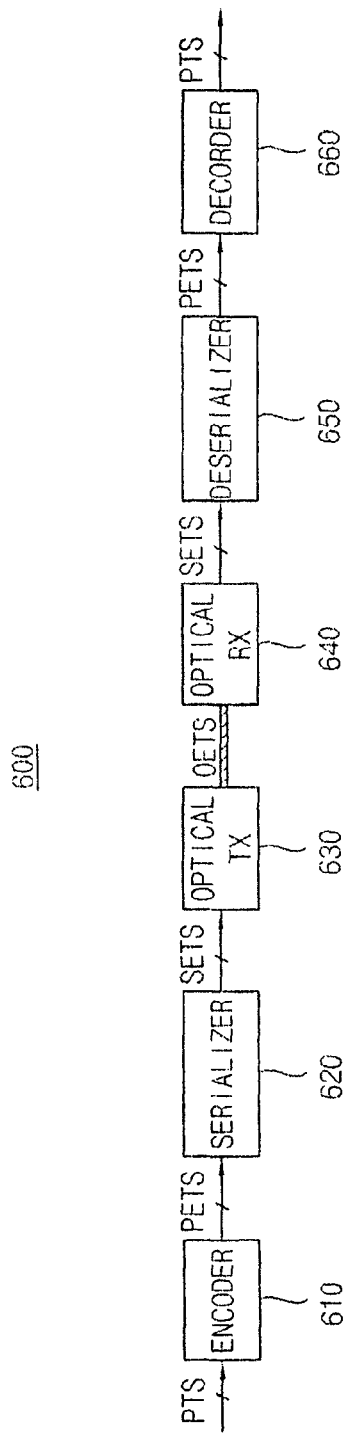

FIG. 6 is a block diagram illustrating an embodiment of a test interface device, in accordance with aspects of the present inventive concept.

Referring to the embodiment of FIG. 6, a test interface device 600 includes an encoder 610, a serializer 620, an optical transmitter 630, an optical receiver 640, a deserializer 650, and a decoder 660.

The encoder 610 encodes parallel test signals PTS, and transmits encoded parallel test signals PETS to the serializer 620. In some embodiments, the encoder 610 may encode parallel test signals PTS using 8B/10B encoding algorithm, which is known in the art, such that each of the parallel test signals PTS may not be fixed at a logic state for a long time. If an optical signal having a fixed logic state is transferred from an optical transmitter to an optical receiver, a baseline wandering phenomenon in an optical path may be caused due to a low frequency of the optical signal. However, in the test interface device 600, the baseline wandering phenomenon may be prevented by the encoder 610. In addition, since the serializer 620 serializes the encoded parallel test signals PETS into an encoded serial test signal SETS, the baseline wandering phenomenon may be further prevented.

The optical transmitter 630 receives the encoded serial test signal SETS from the serializer 620, and coverts the encoded serial test signal SETS into an encoded optical test signal OETS. The optical receiver 640 receives the encoded optical test signal OETS from the optical transmitter 630, and converts the encoded optical test signal OETS into the encoded serial test signal SETS. The deserializer 650 receives the encoded serial test signal SETS from the optical receiver 640, and deserializes the encoded serial test signal SETS into the encoded parallel test signals PETS. The decoder 660 generates the parallel test signals PTS by decoding the encoded parallel test signals PETS. The decoder 660 may use a decoding algorithm corresponding to an encoding algorithm used by the encoder 610.

While in the embodiment of FIG. 6 the encoder 610 encodes a test signal before the test signal is serialized and the decoder 660 decodes the test signal after the test signal is deserialized, the test interface device 600 may include an encoder that encodes the test signal after the test signal is serialized and/or a decoder that decodes the test signal before the test signal is deserialized.

Figure 7:
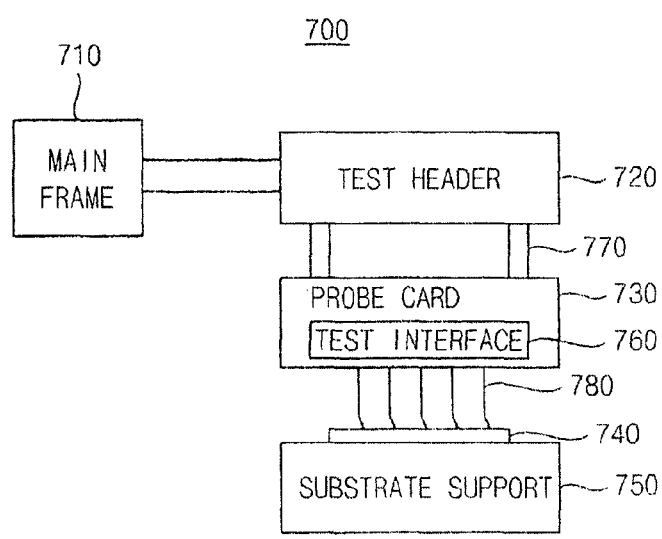

FIG. 7 is a block diagram illustrating an embodiment of a test system, in accordance with aspects of the present inventive concept.

Referring to the embodiment of FIG. 7, a test system 700 includes a test main frame 710, a test header 720, a probe card 730, a wafer 740, and a substrate support 750. The wafer 740 may include a plurality of semiconductor devices that are to be tested.

The test main frame 710 may generate a test signal, and may receive test result signals generated by the semiconductor devices formed in the wafer 740. In some embodiments, the test header 720 may move up and down such that the probe card 730 may be easily attached to the test header 720 and the wafer 740 may be easily mounted on the substrate support 750. In other embodiments, the substrate support 750 may move up and down while the test header 720 is fixed. In still other embodiments, both of the test header 720 and the substrate support 750 may move up and down. The test main frame 710, the test header 720, and the substrate support 750 may constitute an ATE.

The probe card 730 may include a test interface device 760, a connector 770, and probe needles 780. The connector 770 may connect the test header 720 to the test interface device 760, and the probe needles 780 may connect the test interface device 760 to pads of the semiconductor devices on the wafer 740. The test interface device 760 transfers a test signal from the connector 770 to the probe needles 780 using an optical signal transfer technique. Further, the test interface device 760 transfers a test result signal from the probe needles 780 to the connector 770 using the optical signal transfer technique. Accordingly, implementations of the present inventive concepts may transfer the test signal and the test result signal at high speeds, and may increase the overall test speed of the test system 700.

In some embodiments, the optical signal transfer technique may be employed between the test main frame 710 and the test header 720 or between the test header 720 and the probe card 730.

Figure 8:
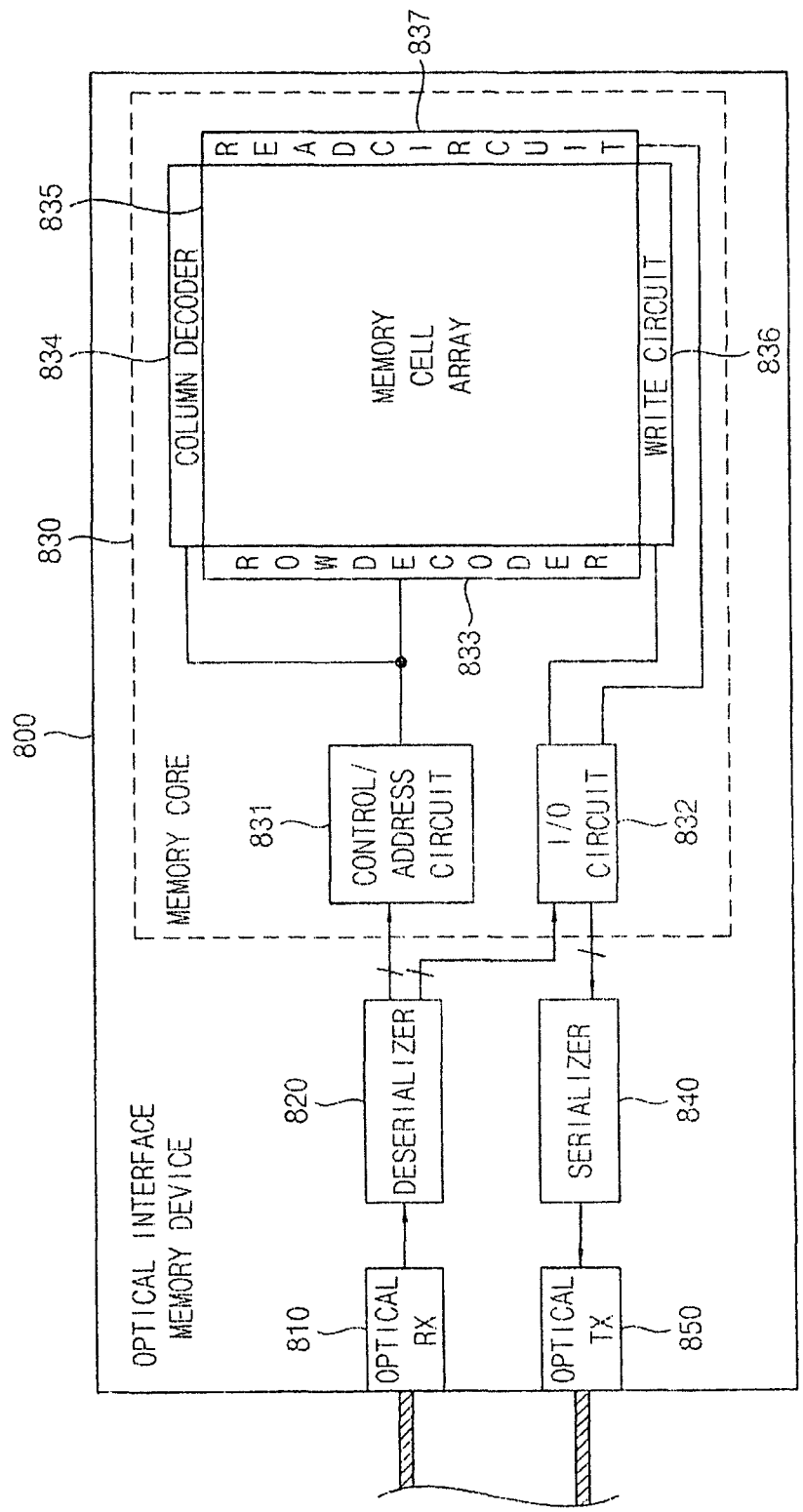

FIG. 8 is a block diagram illustrating an embodiment of an optical interface memory device, in accordance with aspects of the present inventive concept.

Referring to the embodiment of FIG. 8, an optical interface memory device 800 includes an optical receiver 810, a deserializer 820, and a memory core 830. The optical interface memory device 800 may further include a serializer 840 and an optical transmitter 850.

The optical receiver 810 receives an optical input signal from a memory controller (not shown), and converts the optical input signal into an electrical input signal. The deserializer 820 receives the electrical input signal from the optical receiver 810, and deserializer the electrical input signal into parallel input signals. The memory core 830 receives the parallel input signals from the deserializer 820, and performs an operation, such as a data write operation, a data read operation, etc., in response to the parallel input signals. The parallel input signals may include command signals, address signals, and/or input data signals. In some embodiments, command signals and address signals may be input as optical signals through an optical cable, and input data signals may be input as electrical signals through conventional electrical signal lines. The serializer 840 receives parallel output signals from the memory core 830, and serializes the parallel output signals into a serial output signal. The optical transmitter 850 converts the serial output signal into an optical output signal, and transmits the optical output signal to the memory controller (not shown).

The memory core 830 may include a control/address circuit 831, an input/output circuit 832, a row decoder 833, a column decoder 834, a memory cell array 835, a write circuit 836, and a read circuit 837.

In some embodiments, the control/address circuit 831 may change settings of the optical interface memory device 800, determine an operation of the optical interface memory device 800, or output a row address signal and a column address signal to the row decoder 833 and the column decoder 834 in response to the parallel input signals. The row decoder 833 may designate a row of the memory cell array 835 by decoding the row address signal, and the column decoder 834 may designate at least one column of the memory cell array 835 by decoding the column address signal. The write circuit 836 may write input data signals received from the input/output circuit 832 to the memory cell array 835, and the read circuit 837 may read and transmit output data signals from the memory cell array 835 to the input/output circuit 832. The input/output circuit 832 may receive the input data signals from the deserializer 820, and may transmit the output data signals to the serializer 840.

As described above, the optical interface memory device 800, according to some aspects of the present inventive concept, may include the optical transmitter 850 and the optical receiver 810 to transfer input/output signals at high speed using an optical signal transfer technique. Accordingly, implementations of the present inventive concept may increase the overall data processing speed of a computing system including the optical interface memory device 800.

Further, the optical interface memory device 800, according to some aspects of the present inventive concept, may include the serializer 840 and the deserializer 820 to reduce optical resources using a serialization and/or deserialization technique. Accordingly, the size of the optical interface memory device 800 may be reduced.

Figure 9:
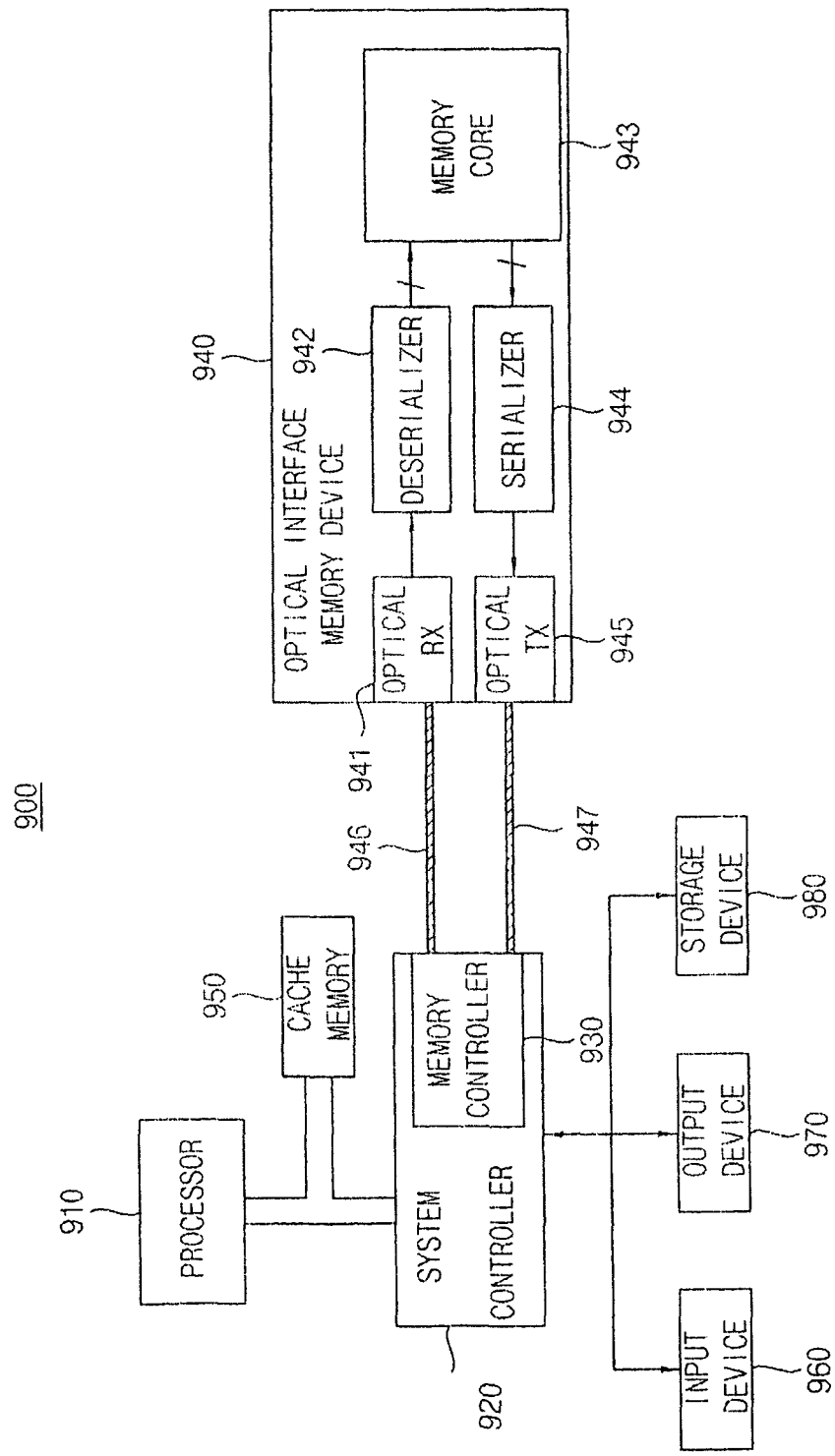

FIG. 9 is a block diagram illustrating an embodiment of a system including an optical interface memory device in accordance with aspects of the present inventive concept.

Referring to the embodiment of FIG. 9, a system 900 includes a processor 910, a system controller 920, and an optical interface memory device 940. The system 900 may further include a cache memory 950, an input device 960, an output device 970, and a storage device 980.

The system controller 920 may include a memory controller 930 that controls the optical interface memory device 940. The memory controller 930 may be coupled to the optical interface memory device 940 through a first optical cable 946 and a second optical cable 947.

The processor 910 may perform various computing functions, such as executing specific software adapted to perform specific calculations or tasks. For example, the processor 910 may be a microprocessor or a central process unit (CPU). The processor 910 may be coupled to the system controller 920 via an address bus, a control bus, and/or a data bus. The system controller 920 may be coupled to an expansion bus, such as a peripheral-component-interconnect (PCI) bus. The processor 910 may control the input device 960 (e.g., a keyboard or a mouse), the output device 970 (e.g., a printer or a display device), and the storage device 980 (e.g., a solid state drive, a hard disk drive, or a compact disk read-only memory (CD-ROM)). The processor 910 may further be coupled to the cache memory 950. The cache memory 950 may store data read from the optical interface memory device 940, and the processor 910 may read the stored data from the cache memory 950, thereby improving data processing speed. For example, the cache memory 950 may be a static random access memory (SRAM).

The memory controller 930 may transmit control signals, address signals, and input data signals through the first optical cable 946 to the optical interface memory device 940, and may receive output data signals from the optical interface memory device 940 through the second optical cable 947. The optical interface memory device 940 may include an optical receiver 941 that receives an optical input signal from the memory controller 930, a deserializer 942 that deserializes a signal from the optical receiver 941 into parallel input signals, a memory core 943 that performs a data write operation or a data read operation based on the parallel input signals, a serializer 944 that serializes parallel output signals from the memory core 943 into a serial output signal, and an optical transmitter 945 that outputs an optical output signal to the memory controller 930.

For example, the optical interface memory device 940 may be a dynamic random access memory (DRAM), a static random access memory (SRAM), or a non-volatile memory, such as an erasable programmable read-only memory (EPROM), an electrically erasable programmable read-only memory (EEPROM), or the like. While in embodiment of FIG. 9 the optical interface memory device 940 is coupled to the memory controller 930, the processor 910 may be directly coupled to the optical interface memory device 940 and may control the optical interface memory device 940 in other embodiments.

According to aspects of the present inventive concept, the test interface device, the test system, and the optical interface memory device may improve signal transfer speed by employing an optical signal transfer technique. Further, the test interface device, the test system, and the optical interface memory device according to aspects of the present inventive concept may reduce optical resource usage by employing a serialization and/or deserialization technique.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A test interface device on a probe card, comprising:
   a first serializer configured to serialize parallel test signals received from an automatic test equipment into a serial test signal;

a first optical transmitter coupled to the first serializer and configured to convert the serial test signal into an optical test signal and to transmit the optical test signal through a first optical cable;

a first optical receiver coupled to the first optical transmitter via the first optical cable and configured to receive the optical test signal through the first optical cable and to convert the optical test signal into the serial test signal;

a first deserializer coupled to the first optical receiver and configured to deserialize the serial test signal into the parallel test signals and to provide the parallel test signals to N devices under test, where N is a natural number greater than 1;

a single result decision circuit coupled to the N devices under test, the single result decision circuit configured to receive N parallel test result signals from the N devices under test, and configured to generate N result decision signals based on the N parallel test result signals received from the N devices under test;

a second serializer configured to serialize the N result decision signals into a serial result decision signal;

a second optical transmitter configured to convert the serial result decision signal into an optical result decision signal and to transmit the optical result decision signal through a second optical cable;

a second optical receiver configured to receive the optical result decision signal through the second optical cable and to convert the optical result decision signal into the serial result decision signal; and a second deserializer configured to deserialize the serial result decision signal into the N result decision signals and to provide the N result decision signals to the automatic test equipment.

2. The test interface device of claim 1, further comprising:
an optical splitter configured to receive the optical test signal from the first optical transmitter and to generate split optical test signals by dividing a path of the optical test signal.

3. The test interface device of claim 2, further comprising:
additional first optical receivers, each of the additional first optical receivers configured to receive one of the split optical test signals and to convert the one of the split optical test signals into the serial test signal.

4. The test interface device of claim 3, further comprising:
additional first deserializers, each of the additional first deserializers configured to deserialize the serial test signal received from each of the additional first optical receivers into the parallel test signals and to provide the parallel test signals to a corresponding device under test from the N devices under test.

5. The test interface device of claim 1, further comprising:
an encoder configured to encode the parallel test signals received from the automatic test equipment and to provide the encoded parallel test signals to the first serializer.

6. The test interface device of claim 5, further comprising:
a decoder configured to decode the parallel test signals received from the first deserializer and to provide the decoded parallel test signals to the device under test.

7. A test system, comprising:
an automatic test equipment configured to generate parallel test signals;

a test interface device on a probe card configured to serialize the parallel test signals into a serial test signal, to convert the serial test signal into an optical test signal, to transfer the optical test signal through an optical cable, to convert the transferred optical test signal into the serial test signal and to deserialize the serial test signal into the parallel test signals internally within the probe card; and N devices under test configured to operate in response to the parallel test signals received from the test interface device, where N is a natural number greater than 1, wherein the test interface device comprises:
a single result decision circuit coupled to the N devices under test, the single result decision circuit configured to receive N parallel test result signals from the N devices under test, and configured to generate N result decision signals based on the N parallel test result signals received from the N devices under test;

a second serializer configured to serialize the N result decision signals into a serial result decision signal;

a second optical transmitter configured to convert the serial result decision signal into an optical result decision signal and to transmit the optical result decision signal through a second optical cable;

a second optical receiver configured to receive the optical result decision signal through the second optical cable and to convert the optical result decision signal into the serial result decision signal; and a second deserializer configured to deserialize the serial result decision signal into the N result decision signals and to provide the N result decision signals to the automatic test equipment.

8. The test system of claim 7, wherein the test interface device further comprises:
an optical splitter configured to receive the optical test signal from the first optical transmitter and to generate split optical test signals by dividing a path of the optical test signal.

9. The test system of claim 8, wherein the test interface device further comprises:
additional first optical receivers, each of the additional first optical receivers configured to receive one of the split optical test signals and to convert the one of the split optical test signals into the serial test signal.

10. The test system of claim 9, wherein the test interface device further comprises:
additional first deserializers, each of the additional first deserializers configured to deserialize the serial test signal received from each of the additional first optical receivers into the parallel test signals and to provide the parallel test signals to a corresponding device under test from the N devices under test.

11. The test system of claim 7, wherein the test interface device further comprises:
an encoder configured to encode the parallel test signals received from the automatic test equipment and to provide the encoded parallel test signals to the first serializer.

12. The test system of claim 11, wherein the test interface device further comprises:
a decoder configured to decode the parallel test signals received from the first deserializer and to provide the decoded parallel test signals to the device under test.

* * * * *